(12) United States Patent
Behrens et al.

(10) Patent No.: US 7,910,831 B2
(45) Date of Patent: Mar. 22, 2011

(54) METHOD AND APPARATUS FOR HIGH-DENSITY POWER DISTRIBUTION UNIT WITH INTEGRATED CABLE MANAGEMENT

(75) Inventors: Edward Behrens, Hopkinton, MA (US);
Tho Tu, Laguna Niguel, CA (US);
David Wang, San Jose, CA (US)

(73) Assignee: Chatsworth Products, Inc., Georgetown, TX (US)

( * ) Notice: Subject to any disclaimer, the term of this patent is extended or adjusted under 35 U.S.C. 154(b) by 0 days.

(21) Appl. No.: 12/793,502

(22) Filed: Jun. 3, 2010

(65) Prior Publication Data

US 2010/0248534 A1    Sep. 30, 2010

Related U.S. Application Data

(63) Continuation of application No. 12/475,144, filed on May 29, 2009.

(60) Provisional application No. 61/057,431, filed on May 30, 2008.

(51) Int. Cl.
*H02G 3/04* (2006.01)

(52) U.S. Cl. .................................................. 174/72 A
(58) Field of Classification Search .............. 174/72 A; 439/215, 211, 540.1
See application file for complete search history.

(56) References Cited

U.S. PATENT DOCUMENTS

| | | | |
|---|---|---|---|
| 5,831,211 A | 11/1998 | Gartung et al. | |
| 6,011,221 A | 1/2000 | Lecinski et al. | |
| 6,245,998 B1 | 6/2001 | Curry et al. | |
| 6,609,034 B1 | 8/2003 | Behrens et al. | |
| 7,356,924 B2 | 4/2008 | Johnson et al. | |
| 7,482,538 B2 * | 1/2009 | Kisu et al. ................... | 174/72 A |

* cited by examiner

*Primary Examiner* — Javaid Nasri
(74) *Attorney, Agent, or Firm* — Snell & Wilmer L.L.P.

(57) ABSTRACT

A cable management unit having a base section and a top section, the base section and the top section defining a space therebetween, a plurality of distribution walls coupled between the base section and the top section and having a front surface facing the space and a back surface facing away from the space, an electronic device disposed within the space, and a plurality of ports disposed on the back surface of the contiguous section of the plurality of distribution walls and each having a port surface extending beyond the back surface of the contiguous section.

19 Claims, 7 Drawing Sheets

METHOD AND APPARATUS FOR HIGH-DENSITY POWER DISTRIBUTION UNIT WITH INTEGRATED CABLE MANAGEMENT

CLAIM OF PRIORITY UNDER 35 U.S.C. §120

This application is a continuation of U.S. patent application Ser. No. 12/475,144, entitled "METHOD AND APPARATUS FOR HIGH-DENSITY POWER DISTRIBUTION UNIT WITH INTEGRATED CABLE MANAGEMENT," filed on May 29, 2009, now U.S. publication number 2010/0248534, which claims the benefit of U.S. provisional patent application No. 61/057,431, filed on May 30, 2008. The entire disclosures of each of these applications are hereby incorporated by reference herein.

BACKGROUND

1. Field of the Invention

The disclosure relates to providing a high-density distribution system with an integrated cable management. More specifically, the disclosure relates to a novel distribution system enabling multiple cables to be received at one unit with minimal cable interference.

2. Description of Related Art

In a conventional distribution system, input receptacles are located in the front and rear faces of the conventional distribution system because there often is an inadequate amount of space in the rear of the conventional distribution system to handle all of the input receptacles.

For example, the conventional 1U distribution system may not have enough space to have 24 receptacles in the rear for 24 cables. However, by having the cables plugged into the front and the rear of the conventional distribution system, the cables in the front of the conventional distribution system need to be routed to the rear of the distribution system for connection to the power supplies or other components. This could cause problems with the cable lengths, access, airflow, tangling, or dislodging of the connections between the cables and the ports.

Therefore, there is a need for a method and apparatus to provide a high-density distribution system with improved cable management ability.

SUMMARY

In one embodiment, a cable management unit may include a base section and a top section, the base section and the top section defining a space therebetween, a plurality of distribution walls coupled between the base section and the top section, the plurality of distribution walls forming a contiguous section, the contiguous section having a front surface facing the space and a back surface facing away from the space, an electronic device disposed within the space, and a plurality of ports disposed on the back surface of the contiguous section of the plurality of distribution walls, each of the plurality of ports having a port surface, the plurality of port surfaces extending beyond the back surface of the contiguous section.

In another embodiment, a power distribution system may include a housing having a base section and a top section, the top section and the base section defining a space therebetween, an electronic device disposed within the space, and a plurality of distribution walls interposed between the base section and the top section, the plurality of distribution walls configured to form a contiguous section having a front surface facing the space and a back surface facing away from the space, the plurality of distribution walls having left, center, right distribution walls, the left and the right distribution walls for establishing one or more connections for the electronic device, the center distribution wall coupled between the left and the right distribution walls.

In yet another embodiment, a power distribution system may include a housing having a base section, a top section, and a side section, the base section, the top section and the side section defining a space therebetween, an electronic device disposed within the space, a concave distribution wall interposed between the top section and the base section, the concave distribution wall having a front surface facing the space and a back surface facing away from the space, and a plurality of ports arranged on the back surface of the concave distribution wall, each port having a port surface extended beyond the back surface of the concave distribution wall, at least one of the plurality of ports is configured to connect the electrical device to one or more connecting members located outside of the space.

The disclosed embodiments can be used as part of a power distribution or data distribution rack. The disclosed embodiments can also include one or more processor circuits in communication with a memory circuit for controlling the input/output of each power distribution or data distribution unit or for the entire rack.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
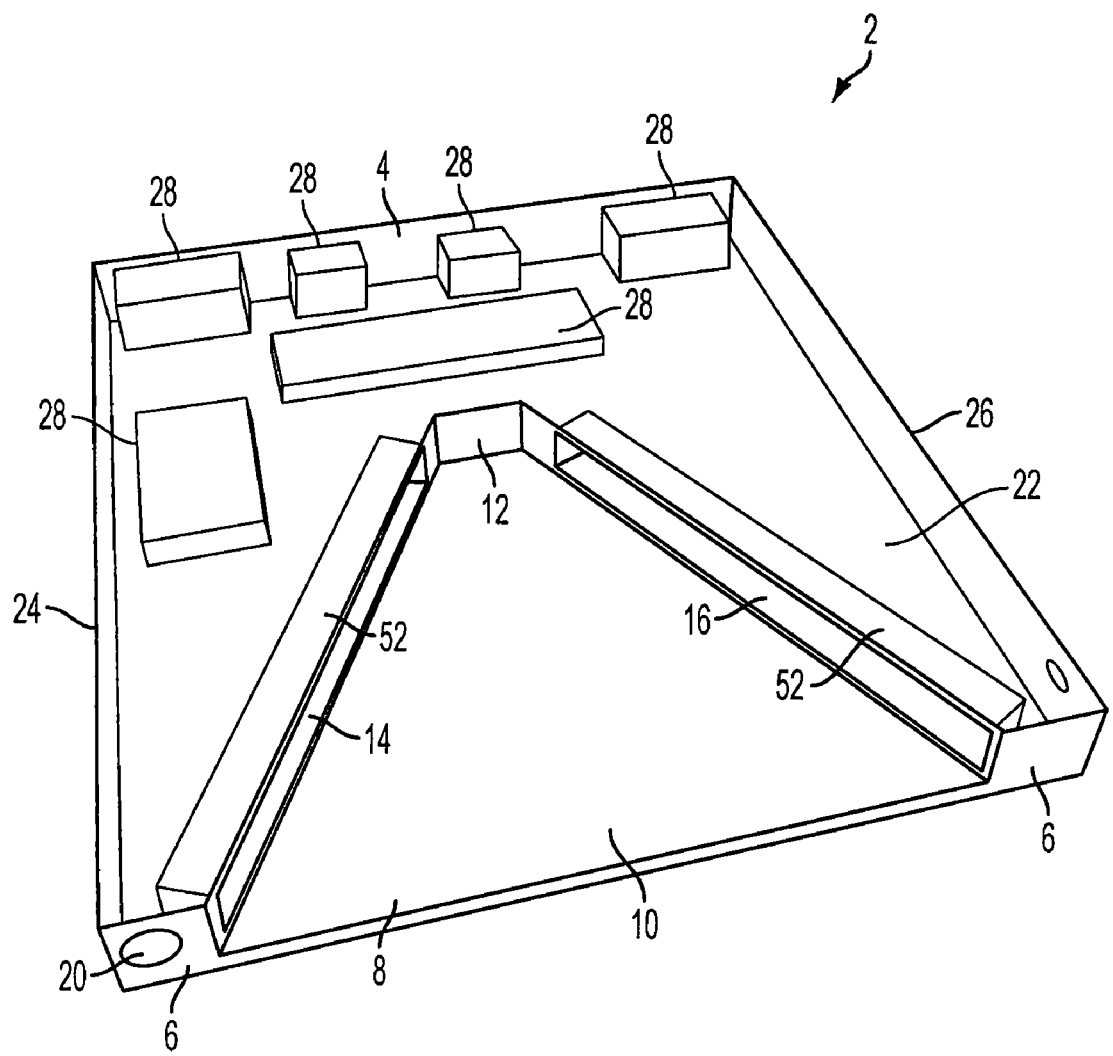
FIG. 1 is a perspective view of a distribution system according to an embodiment of the present invention.
Figure 2:
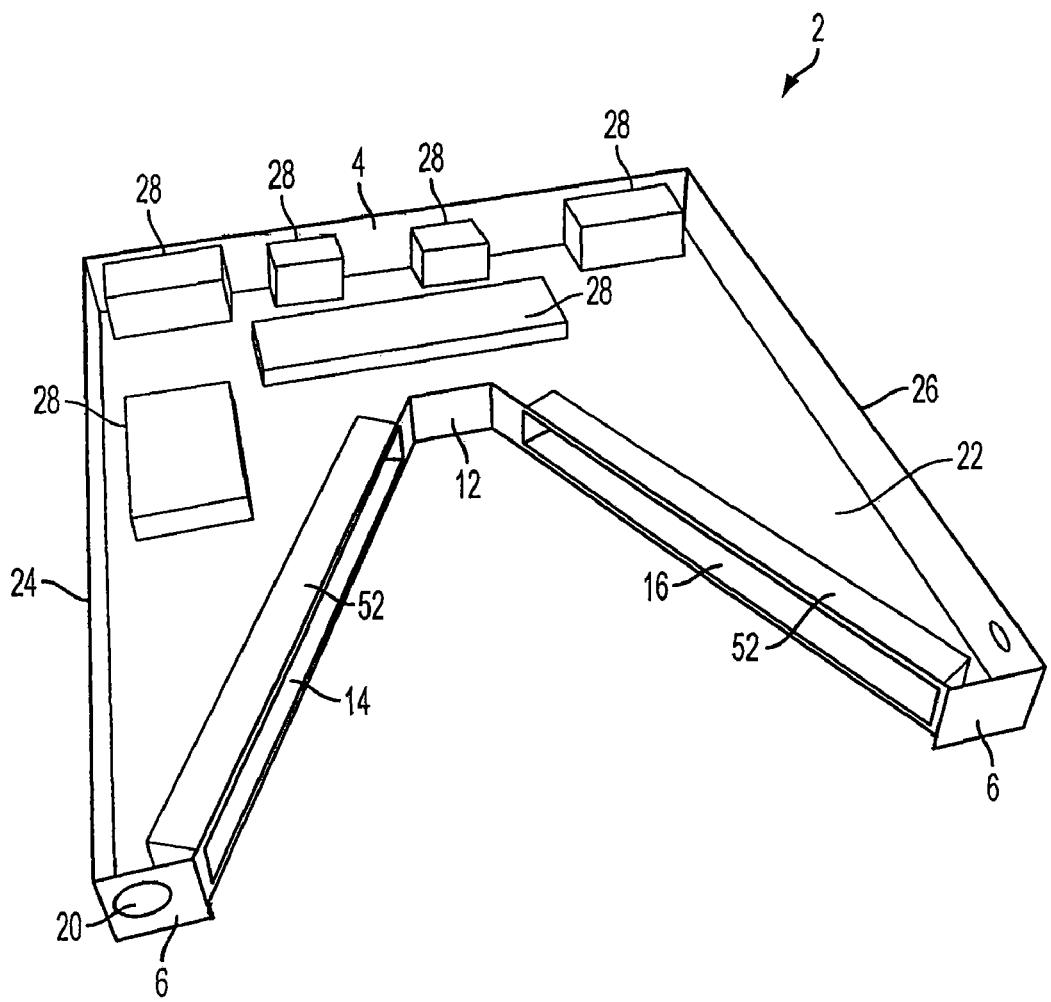
FIG. 2 is a perspective view of the distribution system of FIG. 1 according to an embodiment of the present invention.

FIGS. 1, 2, 3 and 4 are perspective views of a distribution system according to an embodiment of the present invention. Referring simultaneously to FIGS. 1-4, distribution system 2 includes a first side 4, a second side 6, a third side 24, a fourth side 26, a top portion 22, a bottom portion (interchangeably, base section) 8, a distribution portion 10, a first distribution wall 12, a second distribution wall 14, a third distribution wall 16, component receptacles 28 and optional component receptacles 52, and connection 20. Distribution system 2 may also include a cable management bar connected between elements 6 as shown in FIG. 2. Cable management bar can be the same height as elements 6 and may include a number of holes or openings. Each hole allows the passage of a cable that is connected to distribution system 2. Cable management bar prevents cable entanglement at the rear of the distribution system 2.

First distribution wall 12, second distribution wall 14, and third distribution wall 16 form distribution portion 10. In the embodiment of FIGS. 1-4, distribution portion 10 is in the shape of a trapezoid to increase the surface area allocated to the ports. The increased surface area enables substantially more ports to be used with each distribution system. In addition, the trapezoidal arrangement improves and enhances cable management as the cables associated with adjacent ports can be formed into bundles. It should be noted that the trapezoidal shape represents only one embodiment of the disclosure. Other shapes which maximize the surface allocated to the distribution walls, or ultimately increase the number of available ports, can be used without departing from the principles of the disclosure.

In one embodiment, distribution wall 12 is configured to communicate 120 V power at each port 18 of distribution wall 12, while distribution walls 14 and 16 are configured to communicate 208 V and 240 V, respectively. The distribution walls can also provide different current output at each segment. Alternatively, each segment or distribution wall may provide a different power output phase (i.e., single phase and three phase options).

FIGS. 1 and 2 show an embodiment having optional component receptacles 52 positioned along second distribution portion wall 14 and third distribution portion wall 16. Optional Component receptacles 52 can house additional ports 18 as needed. FIG. 1 shows connection 20 which can be used to feed wires directed to optional component receptacles 52.

In one embodiment, ports 18 are power plug outlets, and in another embodiment, ports 18 are for establishing electronic connections. Electronic connections may include, among others, USB connections, firewall connections, cable connections, or any other type of connections or any other type of ports. For a 1U distribution system 2, each of the second and third distribution portion walls 14 and 16 can have a total of 13 or more ports 18. For a 2U distribution system 2, each of the second and third distribution portion walls 14 and 16 can have a total of 25 or more ports 18.

Each of the first, second or third distribution wall can be configured to support a number of ports 18. In the exemplary embodiments of FIGS. 1-4, each of second distribution wall 14 or third distribution wall 16 may have a greater number of ports than first distribution wall 12. Second distribution wall 14 may support an equal number of ports 18 as third distribution wall 16. It should be noted that while the exemplary embodiments of FIGS. 1-4 use distribution walls to support ports 18, the disclosure is not limited thereto. In other words, ports 18 may be positioned on (or integrated with) base section 8 without requiring a distribution wall.

In an exemplary embodiment, at least one optional component receptacle 52 disposed on second distribution wall 14 or on third distribution wall 16 houses at least 13 ports. In another embodiment, at least one of optional component receptacle 52 disposed on second distribution wall 14 or on third distribution wall 16 houses at least 25 ports. In one embodiment, first distribution wall 12 can have one or more ports.

In the embodiment of FIGS. 1-4, distribution walls 12, 14 and 16 form a contiguous V-shaped section which forms a right-angle with base section 8. In another embodiment of the disclosure, the first, second and third distribution walls may be disconnected from each other. The distribution walls may also form an acute angle with base section 8. By forming a trapezoidal shape along base section 8, optional component receptacles 52 which reside along second distribution wall 14 and third distribution wall 16 can encompass an expanded distribution portion 10. The expanded area allows more ports 18 to be housed by power distribution system 2.

Figure 4:
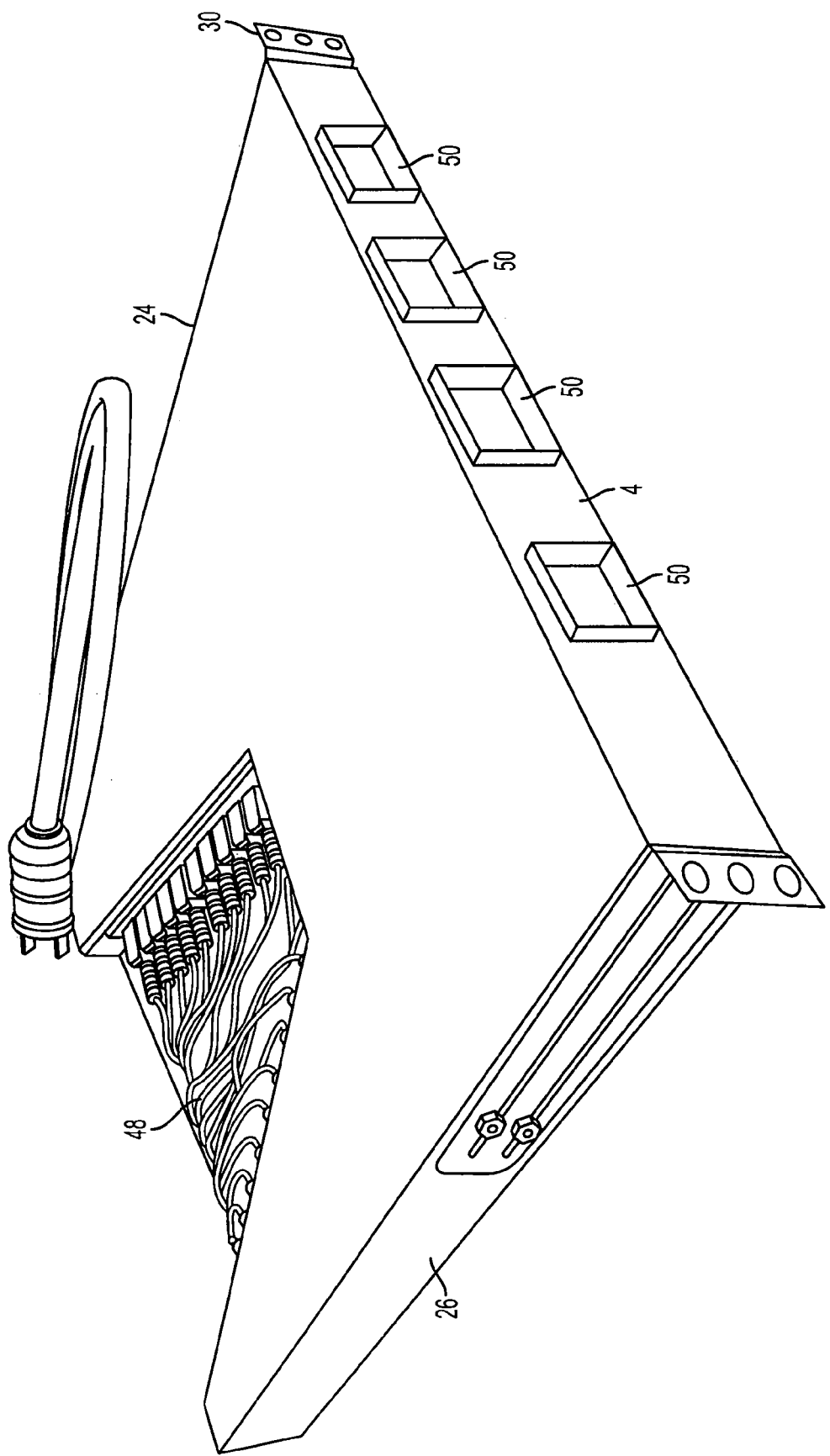
FIG. 4 is a perspective view of the distribution system of FIG. 1 according to an embodiment of the present invention.

FIG. 4 shows cables 48 connected to ports 18. Cables 48 can be, for example, IEC C14 or any power cord (IEC C13 is the female plug and IEC C14 is the male plug). Since more ports 18 can be housed in a single location, cables 48, which connect to ports 18, can be easily located. Furthermore, by having cables 48 connected to ports 18 in a single location, there is less likelihood of cables 48 becoming entangled with each other as they are less likely to be strung haphazardly from different locations along distribution system 2. Since ports 18 are housed in a single central location, it is less likely that cables 48 can become tangled with each other or with other objects. Furthermore, by having the configuration of the present invention, it is less likely that cables 48 can be accidentally or inadvertently disconnected from ports 18.

For example, if cables 48 were connected at first side 4, cables 48 may have to be routed to second side 6 for connecting to other components. This could cause cables 48 to be entangled with themselves or other objects as they are being routed to second side 6. Furthermore, cables 48 could become disengaged from ports 18 along first side 4. In addition, if cables 48 become entangled with other objects, cables 48 could inadvertently move distribution system 2 or cause distribution system 2 to have a sudden impact upon a foreign surface causing damage to distribution system 2.

Figure 3:
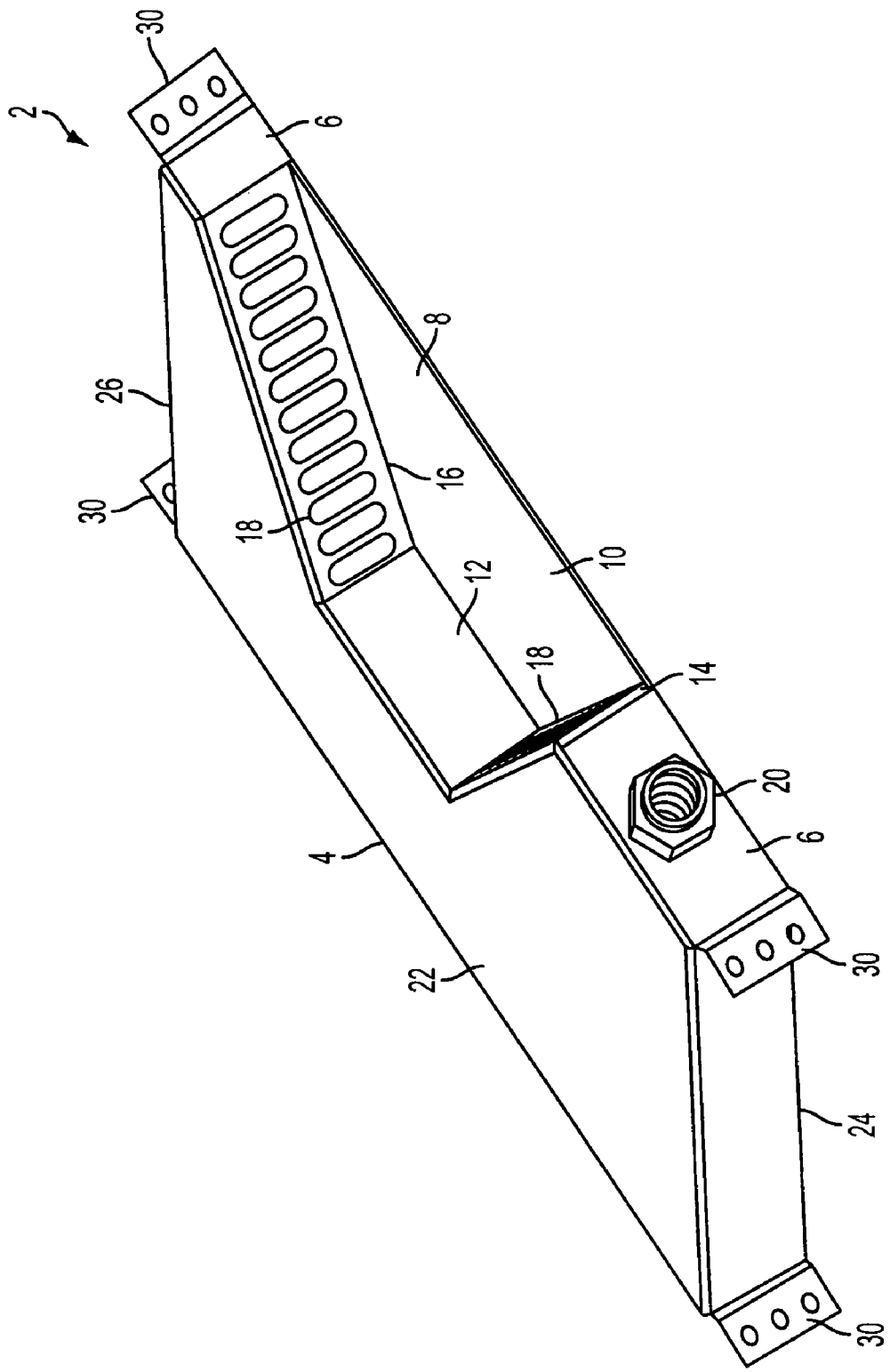
FIG. 3 is a perspective view of the distribution system of FIG. 1 according to an embodiment of the present invention.

Referring again to the embodiment of FIGS. 1-3, connection 20 is located on side 6. Connection 20 could be a master power plug or any other type of ports such as serial ports, Ethernet ports, and/or environmental ports. A fuse box (not shown) or a breaker (not shown) may be arranged in the proximity of connection 20 to provide surge protection for the circuit. In one embodiment of the disclosure, connection 20 may also includes a locking mechanism to prevent accidental disconnection of the main power supply from power distribution system 2. In the exemplary embodiment of FIG. 3, connection 20 includes a bolt for securely receiving an incoming line.

Component receptacles 28 can be used to house components such as circuit breakers, meters, serial ports, Ethernet ports, and/or environmental ports, etc. Optional component port 52 arranged on the distribution walls 12, 14, and 16 can be used to receive connection ports 18. In one embodiment of the disclosure, first distribution wall 12 is covered with a bracket instead of ports to allow easy access to receptacles situated at the far end of the distribution system 2. In still another embodiment of the disclosure, a display unit is provided on the distribution system 2 to display data. The displayed data may include power setting, time, environmental factors (e.g., temperature) or any other attribute of the power distribution unit's operation.

FIG. 4 shows mounting brackets 30 which allows securing the power distribution system 2 to a housing, a rack or any other support structure. Mounting brackets 30 allow a plurality of power distribution units 2 to be received at a rack infrastructure. The distribution units can be mounted to the rack horizontally or vertically. When used with a data system, distribution system 2 can be integrated into a rack infrastructure to house multiple data distribution units on one rack to thereby consolidate functionality that is typically performed by multiple conventional units.

Distribution system 2 can also have one or more processor circuits in communication with a memory circuit for controlling input/output through ports 18. In an exemplary embodiment, distribution system 2 can be used as part of a data server and ports 18 can be USB (or similar) data ports. Component receptacles 28 can house I/O control circuits for controlling data transmission through each of the multiple ports. In still another embodiment, component receptacles 28 can house cooling devices such as electro-mechanical fans for cooling power distribution system 2.

Figure 8:
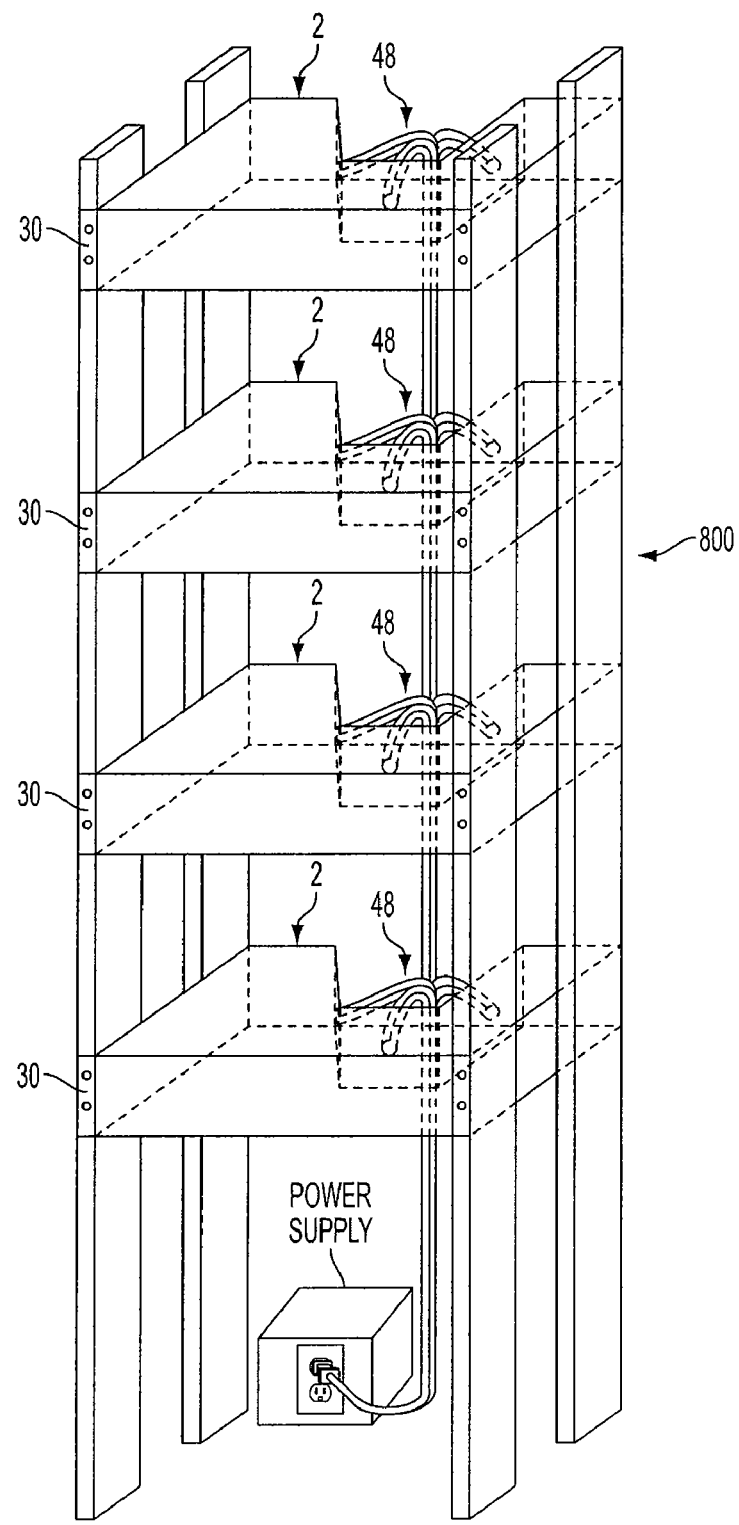
FIG. 8 is a perspective view of a rack holding several power distribution systems according to an embodiment of the present invention.

In an exemplary embodiment where a rack may store a plurality of distribution systems 2, at least one of the distribution systems 2 can be used to control operation of the other units in the rack. If the distribution systems 2 are used primarily as data distribution hubs, then the designated controller unit can be used to control the Input/Output from each of ports 18 in each distribution system 2. For example, FIG. 8 shows an exemplary embodiment using a rack 800 to store multiple power distribution units 2 by using brackets 30 to secure each power distribution system 2. As shown in FIG. 8, the power distribution units 2 may be connected with one another via the cables 48.

Figure 5:
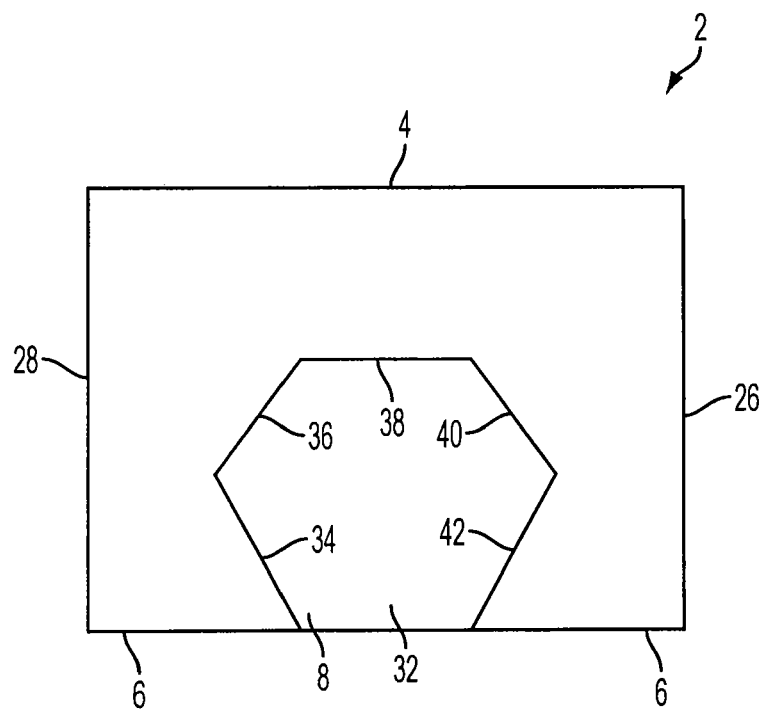
FIG. 5 is a top view of an alternative distribution system according to an embodiment of the present invention.

FIG. 5 is a top view of an alternative distribution system 2 according to an embodiment of the present invention. In FIG. 5, distribution system 2 has a distribution portion 32 formed in a hexagonal shape along bottom surface 8. Distribution portion 32 is formed by sides 34, 36, 38, 40 and 42. Sides 34 and 36 may form an acute angle or a right angle, whereas sides 36 and 38 may form an obtuse angle. Similarly, sides 42 and 40 may form an acute angle or a right angle, whereas sides 40 and 38 may form an obtuse angle.

Figure 6:
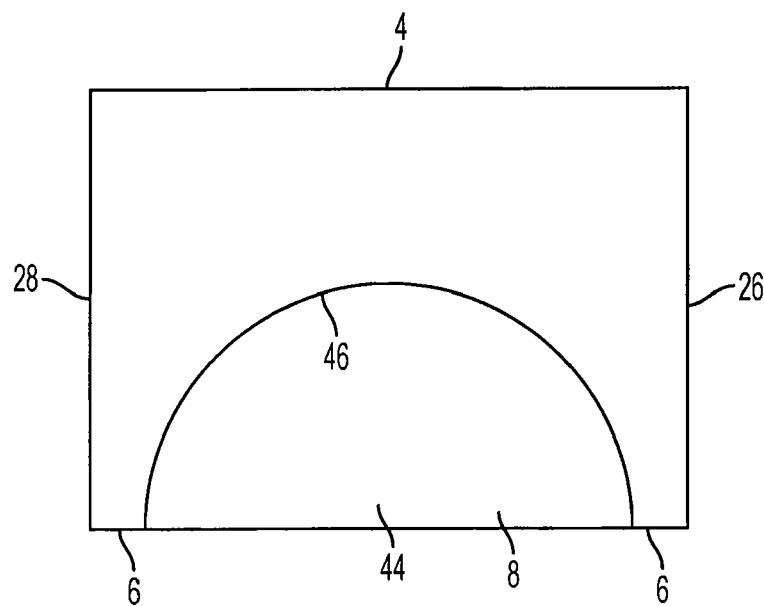
FIG. 6 is a top view of an alternative distribution system according to an embodiment of the present invention.

FIG. 6 is a top view of an alternative distribution system 2 according to an embodiment of the present invention. As seen in FIG. 6, distribution system 2 has a distribution portion 44 formed in a curved (e.g., semi-circle or an arc) shape along bottom surface 8. Distribution wall 44 is formed by a curved segment 46.

Figure 7:
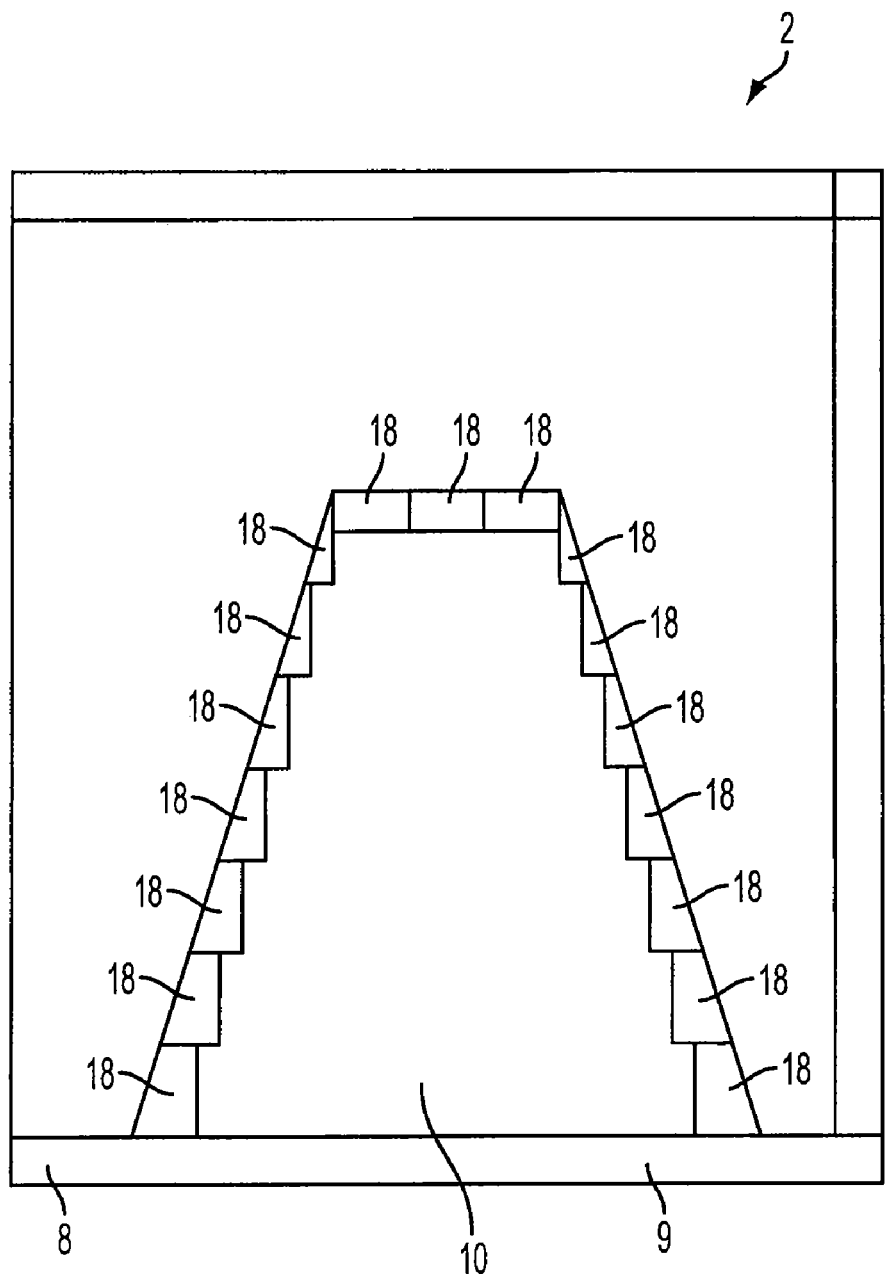
FIG. 7 is a schematic representation of another embodiment of the present invention.

FIG. 7 is a schematic representation of another embodiment of the disclosure. Distribution system 2 of FIG. 7 is may include a base section 8 supporting a plurality of ports 18. Each of the plurality of ports 18 is so positioned that the port surface of the port is substantially parallel to the edge 9 of the base section 8. In this manner, connecting and disconnecting from ports 18 would be easier.

While the principles of the disclosure have been illustrated in relation to the exemplary embodiments shown herein, the principles of the disclosure are not limited thereto and include any modification, variation or permutation thereof.

What is claimed is:

1. A cable management unit, comprising:
a base section and a top section, the base section and the top section defining a space therebetween;
a plurality of distribution walls permanently connected between the base section and the top section, the plurality of distribution walls forming a contiguous section, the contiguous section having a front surface facing the space and a back surface facing away from the space;
an electronic device disposed within the space; and
a plurality of ports disposed on the back surface of the contiguous section of the plurality of distribution walls, each of the plurality of ports having a port surface, the plurality of port surfaces extending beyond the back surface of the contiguous section.

2. The cable management unit of claim 1, wherein the port surfaces of the plurality of ports form a plurality of port angles with the respective distribution wall on which the plurality of ports are disposed.

3. The cable management unit of claim 1, wherein the contiguous section has a contour selected from a group consisting of a V-shape, an open-base-trapezoid, a U-shape, an open-base-pentagon, and combinations thereof.

4. The cable management unit of claim 1, wherein each of the plurality of ports is parallel to every other port of the plurality of ports, further wherein each of the plurality of ports is located on a different geometric plane from at least one other port of the plurality of ports.

5. The cable management unit of claim 1, wherein the electronic device is selected from a group consisting of a fuse, a memory device, a processor, an input-output control device, a cooling device, and combinations thereof.

6. The cable management unit of claim 1, wherein at least one of the plurality of distribution walls forms an acute angle or a right angle with the base section.

7. The cable management unit of claim 1, wherein the port surfaces of the plurality of ports are parallel to a rear side of the base section.

8. A distribution system, comprising:
a housing having a base section and a top section, the top section and the base section defining a space therebetween;
an electronic device disposed within the space; and
a plurality of distribution walls interposed between the base section and the top section, the plurality of distribution walls configured to form a contiguous section having a front surface facing the space and a back surface facing away from the space, the plurality of distribution walls having a left distribution wall, a center distribution wall, and a right distribution wall, the left distribution wall and the right distribution wall having a plurality of ports, one or more of the plurality of ports for establishing one or more connections with the electronic device, the plurality of ports each having a port surface extending beyond the back surface of the contiguous section, and the plurality of distribution walls having the center distribution wall coupled between the left and the right distribution walls.

9. The distribution system of claim 8, wherein the port surfaces of the ports are substantially parallel to a rear edge of the base section.

10. The distribution system of claim 8, wherein the port surfaces of the ports form a plurality of right angles or acute angles with the base section.

11. The distribution system of claim 8, wherein the port surfaces of the ports distributed on the left distribution wall form a plurality of left acute angles with the left distribution wall, and the port surfaces of the ports distributed on the right distribution wall form a plurality of right acute angles with the right distribution wall.

12. The distribution system of claim 8, wherein the center distribution wall supports one or more ports for establishing one or more connections for the electronic device disposed within the space.

13. The distribution system of claim 8, wherein the contiguous section of the plurality of distribution walls combined with a rear edge of the base section to define a support surface having a geometric shape selected from a group consisting of a triangle, a trapezoid, a semi-circle, a rectangle, a pentagon, and combinations thereof.

14. The distribution system of claim 8, wherein the plurality of distribution walls forms a concave distribution section.

15. A power distribution system, comprising:
a housing having a base section, a top section, a first outer wall and a second outer wall, the base section lying on a first plane, the top section lying on a second plane substantially parallel to the first plane, the first outer wall coupled to the base section and the top section, the first outer wall lying on a third plane substantially perpendicular to the first plane, and the second outer wall coupled to the base section and the top section, the second outer wall lying on a fourth plane substantially parallel to the third plane;

an electronic device disposed within the housing; and a distribution wall having a first edge and a second edge, the distribution wall located between the first outer wall and the second outer wall, and coupled to both the base section and the top section, wherein a length along the distribution wall between the first edge and the second edge is greater than a shortest length between the first edge and the second edge, the distribution wall further having a plurality of ports on a surface of the distribution wall, wherein at least one of the plurality of ports is configured to be coupled to the electronic device, and further wherein each of the plurality of ports has a port surface extending beyond the back surface of the distribution wall.

16. The power distribution system of claim 15, wherein the distribution wall is shaped to form n-1 sides of a geometric shape having n sides.

17. The power distribution system of claim 15, wherein at least two ports of the plurality of ports are located on different geometric planes.

18. The power distribution system of claim 17, wherein each of the plurality of port surfaces are substantially parallel to a rear side of the base section.

19. The power distribution system of claim 17, wherein the housing further includes a back wall, the back wall configured to be orthogonal to the top section, the bottom section, the first outer wall and the second outer wall, wherein the first outer wall, the second outer wall, and the distribution wall form an inside region where the electronic device is disposed within the housing, wherein at least one of the plurality of ports on the distribution wall is configured to allow coupling of the electronic device to an object outside of the housing, further wherein the plurality of ports are placed adjacent to each other and substantially span the length of the distribution wall.

* * * * *